US006978027B1

(12) United States Patent
Dahl et al.

(10) Patent No.: US 6,978,027 B1
(45) Date of Patent: Dec. 20, 2005

(54) REVERBERATION PROCESSOR FOR INTERACTIVE AUDIO APPLICATIONS

(75) Inventors: Luke Dahl, Santa Cruz, CA (US); Jean-Marc Jot, Aptos, CA (US); Vincent Vu, Berkeley, CA (US); Dana Massie, Santa Cruz, CA (US)

(73) Assignee: Creative Technology Ltd., (SG)

( * ) Notice: Subject to any disclaimer, the term of this patent is extended or adjusted under 35 U.S.C. 154(b) by 0 days.

(21) Appl. No.: 09/547,365

(22) Filed: Apr. 11, 2000

(51) Int. Cl.[7] .............................................. H03G 3/20

(52) U.S. Cl. .......................................... 381/63; 84/630

(58) Field of Search ................................ 381/61–66, 1, 381/17; 84/630, 629, 620; 700/94

(56) References Cited

U.S. PATENT DOCUMENTS

| | | | | |
|---|---|---|---|---|
| 4,338,581 | A * | 7/1982 | Morgan | 381/63 |
| 4,731,835 | A | 3/1988 | Futamase et al. | |
| 4,731,848 | A * | 3/1988 | Kendall et al. | 381/63 |
| 4,817,149 | A * | 3/1989 | Myers | 381/1 |
| 5,131,051 | A * | 7/1992 | Kishnaga et al. | 381/82 |
| 5,491,754 | A | 2/1996 | Jot et al. | |
| 5,553,150 | A * | 9/1996 | Kozuki | 381/61 |
| 5,619,579 | A * | 4/1997 | Ando et al. | 381/63 |
| 5,657,476 | A * | 8/1997 | O'Connell et al. | 395/493 |
| 5,689,571 | A * | 11/1997 | Kitamura | 381/63 |
| 5,781,461 | A * | 7/1998 | Jaffe et al. | 364/724.012 |
| 6,032,235 | A * | 2/2000 | Hoge | 711/156 |
| 6,188,769 | B1 * | 2/2001 | Jot et al. | 381/63 |
| 6,483,922 | B1 * | 11/2002 | Limacher | 381/63 |

OTHER PUBLICATIONS

Stautner, John, et al., "Designing Multi-Channel Reverberators", Computer Music Journal, 1982, vol. 6, No. 1, pp. 52-65.

Jot, Jean-Marc, "Efficient models for reverberation and distance rendering in computer music and virtual audio reality", Proceedings ICMC, 1997, pp. 236-243.

Dattorro, Jon, "Effect Design (Part 1: Reverberator and Other Filters)", J. Audio Eng. Soc., Sep. 1997, vol. 45, No. 9, pp. 660-684.

Dattorro, Jon, "Effect Design (Part 2: Delay-Lin Modulation and Chorus)", J. Audio Eng. Soc., Oct. 1997, vol. 45, No. 10, pp. 764-788.

Laakso, Timo I., et al., "Splitting the Unit Delay-Tools for fractional delay filter design", IEEE Signal Processing Magazine, Jan. 1996, vol. 13, No. 1, pp. 30-60.

Van Duyne, Scott A., et al., "A Lossless, Click-free, Pitchbend-able Delay Line Loop Interpolation Scheme", Proceedings ICMC, 1997, pp. 252-255.

* cited by examiner

*Primary Examiner*—Vivian Chin
*Assistant Examiner*—Lun-See Lao
(74) *Attorney, Agent, or Firm*—Schwegman, Lundberg, Woessner & Kluth, P.A.

(57) ABSTRACT

An improved reverberation processor includes a technique for changing environmental parameters without causing disturbing audio artifacts. The technique includes the steps of sequentially changing the read pointers of different delay lines. Additionally, for each delay line a level control variable is ramped down prior to changing the read pointer and then ramped back up. The reverberation processor also provides means for producing and controlling a repeating echo in the reverberation decay, as well as adjusting the diffusion (or echo density) of the reverberation.

4 Claims, 5 Drawing Sheets

REVERBERATION PROCESSOR FOR INTERACTIVE AUDIO APPLICATIONS

BACKGROUND OF THE INVENTION

Virtual auditory displays (including computer games, virtual reality systems or computer music workstations) create virtual worlds in which a virtual listener can hear sounds generated from sound sources within these worlds. In addition to reproducing sound as generated by the source, the computer also processes the source signal to simulate the effects of the virtual environment on the sound emitted by the source. In a first-person computer game, the player hears the sound that he/she would hear if he/she were located in the position of the virtual listener in the virtual world. One important environmental factor is reverberation, which refers to the reflections of the generated sound which bounce off objects in the environment. Reverberation can be characterized by measurable criteria, such as the reverberation time, which is a measure of the time it takes for the reflections to become imperceptible. Computer generated sounds without reverberation sound dead or dry.

Artificial reverberation algorithms are well known in the art and are described e.g. in Stautner, J., and Puckette, M. (1982). Designing Multi-Channel Reverberators. *Computer Music Journal*, Vol. 6, no. 1, Dattorro, J. (1997). Effect Design (Part 1: Reverberator and Other Filters; Part 2: Delay-Line Modulation and Chorus). *Journal of the Audio Engineering Society*, Vol. 45, no. 9–10, Jot, J.-M. (1997). Efficient Models for Reverberation and Distance Rendering in Computer Music and Virtual Audio Reality. *Proceedings of the* 1997 *International Computer Music Conference*. The implementation of these algorithms on digital signal processors is based on a network of digital delay lines which are connected together and to the input and output points of the algorithm by feed-forward or feedback connections. Rooms of different sizes and acoustical properties can be simulated by modifying the topology of the network (the number of delay lines and the connections between them), by varying the duration of the delays, or by adjusting the amplification or attenuation coefficients of multipliers and filters inserted on the feed-forward or feedback connections.

As depicted in FIG. 1, a typical model of reverberation breaks the reverberation effects into discrete time segments. The first signal that reaches the listener is the direct-path signal, which undergoes no reflections. Subsequently, a series of discrete "early" reflections are received during an initial period of the reverberation response. Finally, after a critical time, the exponentially decaying "late" reverberation is modeled statistically because of the combination and overlapping of the various reflections. The magnitudes of Reflections_delay and Reverb_delay are typically dependent on the size of the room and on the position of the source and the listener in the room. As illustrated in FIG. 2*a*, the early reflections and the late reverberation are often generated by two separate processing modules whose output signals are combined to produce the output of the reverberation processor. Examples of an early reflection module and a late reverberation module are shown on FIGS. 2*b* and 2*c*, respectively. The lengths of delay lines comprising these modules can be made smaller or larger according to the size of the virtual room.

Reverberation processors of the type described above are commonly used for the production of music and soundtracks in recording studios. In these applications, it is not common to produce drastic changes in reverberation characteristics while the sound is playing. Noticeable drop-offs and other artifacts in the output signal of the processor will occur, for instance, when the user loads a different reverberation "program" or adjusts the room size parameter (which may involve changing the network structure or modifying delay lengths). However, such artifacts are not acceptable in interactive audio applications. In immersive 3D games or simulation systems, for instance, different reverberation settings may be associated with different rooms or environments composing a virtual 3D world in which the virtual listener is allowed to travel. Consequently, in these systems, the reverberation processor must be able to change settings while creating a minimum of disruptive or distracting audible artifacts.

Artifacts due to dynamic changes in reverberation settings can be avoided by using two reverberation processors set to simulate different room acoustics and cross-fading from one processor to the other (at their input or at their output). However, it is generally more advantageous to use a single reverberation processor and modify its parameters in order to produce the desired change in room acoustics. The coefficients of multipliers and filters comprising a reverberation processor are easily changed, without noticeable artifacts, by ramping their values to new values over a short time. This avoids the introduction of sudden discontinuities in the audio signal waveform, audible as pops or clicks. For the same reason, it is necessary to avoid sudden changes in the duration of the delay lines.

Methods for implementing continuously variable delays are well known in the art and are described e.g. in Laakso, T. I. et al. (1996). Splitting the Unit Delay—Tools for Fractional Delay Filter Design. *IEEE Signal Processing Magazine*, Vol. 13, no. 1. However, these methods involve digital audio interpolators, adding significant computational complexity to each delay line. Furthermore, when an interpolator is used, a large variation in a delay length can produce a noticeable change in the pitch of the delayed signal, which may result in an audible artifact. Another technique for implementing variable delays is described in Van Duyne, S. A. (1997). A Lossless, Click-Free, Pitchbendable Delay Line Loop Interpolation Scheme. *Proceedings of the* 1997 *International Computer Music Conference* and illustrated in FIG. 2*d*. In this technique, a delay change is realized by cross-fading between two signals read from two different locations (or "taps") in the delay line's memory. These two taps are provided by two read pointers whose locations in the memory correspond to the original delay value and the final delay value. This method moves the read pointer to a new location in the delay memory without causing a drop-off, a discontinuity or a pitch alteration in the delayed audio signal. However, it causes a temporary timbre alteration known as "comb filter effect".

In order to provide a wider range of variation in simulated room acoustics, it is common to allow control for the echo density of the reverberation decay, suggesting more or less diffusing room walls. For instance, the reverberation algorithm described in Dattorro, supra allows to control diffusion by adjusting the feedback coefficients of a set of all-pass filters in the reverberation network. Another kind of common musical effect, also described e.g. in Dattorro supra, is the echo effect, which can be obtained simply by a single delay line with feedback. A cyclic echo can sometimes be obtained with existing reverberation algorithms as a side effect—usually unwanted—for particular settings of a reverberation processor's parameters. However, reverberators such as described in the above references do not provide parameters for controlling explicitly and intuitively aspects of an echo effect embedded in the reverberation decay. Such control would be useful to simulate larger rooms or semi-open environments such as a courtyard.

SUMMARY OF THE INVENTION

According to one aspect of the invention, audio artifacts are minimized when changing reverberation settings by causing the amplitude of a signal from a delay line having its read pointers changed to ramp down prior to moving the read pointer. The amplitude of the signal is then ramped up after the read pointer has been moved.

According to another aspect of the invention, a set of delay lines, whose output signals are combined to produce the output of a reverberation processor, are updated in sequence so that there is no audible drop-off in the processor's output signal.

According to another aspect of the invention, a reverberation processor provides continuous control over the salience of a periodically repeating echo in the late reverberation decay.

According to another aspect of the invention, a reverberation processor simultaneously provides continuous control over the salience of a periodically repeating echo in the late reverberation decay, and over the duration between successive repetitions of this echo.

According to another aspect of the invention, a reverberation processor simultaneously provides continuous control over the salience of a periodically repeating echo in the late reverberation decay, and over the "diffusion" (or echo density) of the reverberation decay. Furthermore, these two controls combine so that reducing the amount of diffusion has the effect of prolonging the audibility of the repeating echo along the reverberation decay.

Other features and advantages of the invention will be apparent in view of the following detailed description and appended drawings.

DESCRIPTION OF THE SPECIFIC EMBODIMENTS

Figure 1:
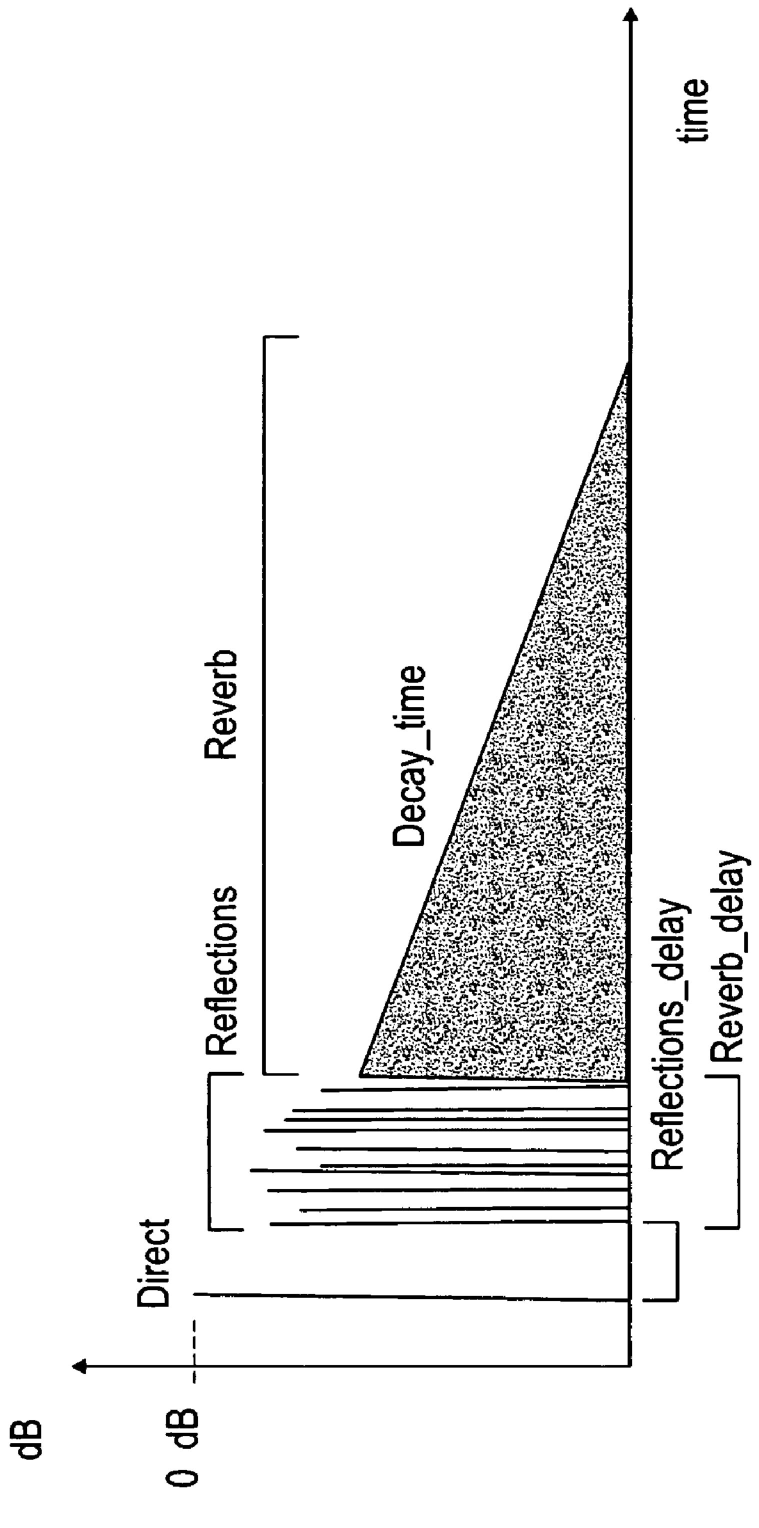
FIG. 1 is a graph depicting the division of the reverberation response into early reflections and late reverberation.
Figure 2A:
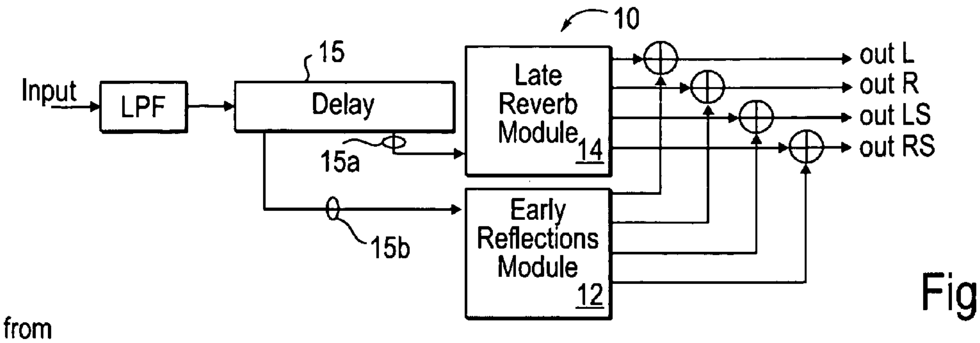
FIG. 2*a* is a block diagram of a reverberation processor, made of an early reflections module and a late reverberation module.

FIG. 2*a* depicts a standard reverberation processor. The reverberation processor 10 has one input and four outputs: Left, Right, Right Surround, and Left Surround. It is has two primary components: the Early Reflections module 12, and the Late Reverb module 14. The input signal is low-pass filtered and then passes into a delay line 15 (roomDelay). The delay line 15 has two taps, reverbRead 15*a* and reflRead 15*b*, which feed the early reflections and reverberation module 12 and 14. Each of the four outputs of the Early Reflections module 12 is added to one of the four outputs of the Late Reverb module 14, and these signals are the reverberation outputs.

In a preferred embodiment of the present invention, the reverberation processor can be controlled by the following set of parameters (several of which would be affected by a simulated change of the room size):

- Reflections Delay: the delay of the first early reflection relative to the direct-path signal.
- Reverb Delay: the delay of the late reverberation onset relative to the first early reflection.
- Reflections Level: the amplitude level of the early reflections.
- Reverb Level: the amplitude level of the late reverberation.
- Decay Time: the time it takes for the late reverberation to decay by 60 dB at low frequencies.
- Decay HF Ratio: the ratio of the high-frequency decay time relative to the low-frequency decay time.
- Modal Density: the total length of the delay lines comprising the Late Reverb module.
- Diffusion: the echo density in the late reverberation.
- Echo Depth: the salience of a repeating echo in the late reverberation.
- Echo Time: the duration between successive repetitions of an echo in the late reverberation.

The problem of switching reverberation settings while creating minimal disruptive or disturbing artifacts is remedied in an embodiment of the present invention by the following mechanism. Any signals coming from delay line reads whose location might be changed are multiplied by variable coefficients. If the reverberation algorithm would not normally call for a multiply to be performed on that signal, it is multiplied by 1. When the delay line read pointer must be moved, the multiply coefficient is ramped towards zero. A short time later, when the coefficient has reached a sufficiently low value, the read pointer is moved, and the coefficient is then ramped back up to its correct value. If multiple delay line read pointers must be moved, they are moved sequentially so that the audible impact of dips in the delayed signals is minimized at any moment.

This method of updating delay lengths in a reverberation processor is particularly efficient because:

- the additional computational cost is limited, at most, to one multiplication per variable delay line read in the network, and,
- a single ramper can be shared between all the delay line reads (since the read pointers are updated one at a time).

With this scheme, quick drops in audio parts of the reverberation are sometimes audible (the entire reverberation signal is never muted at once, but aspects of the sound may be heard to dip). Echoes are sometimes created when delay line read pointers are moved to much longer values. However, the overall effect is usually subtle and much less distracting than clicks and pops.

Figure 2B:
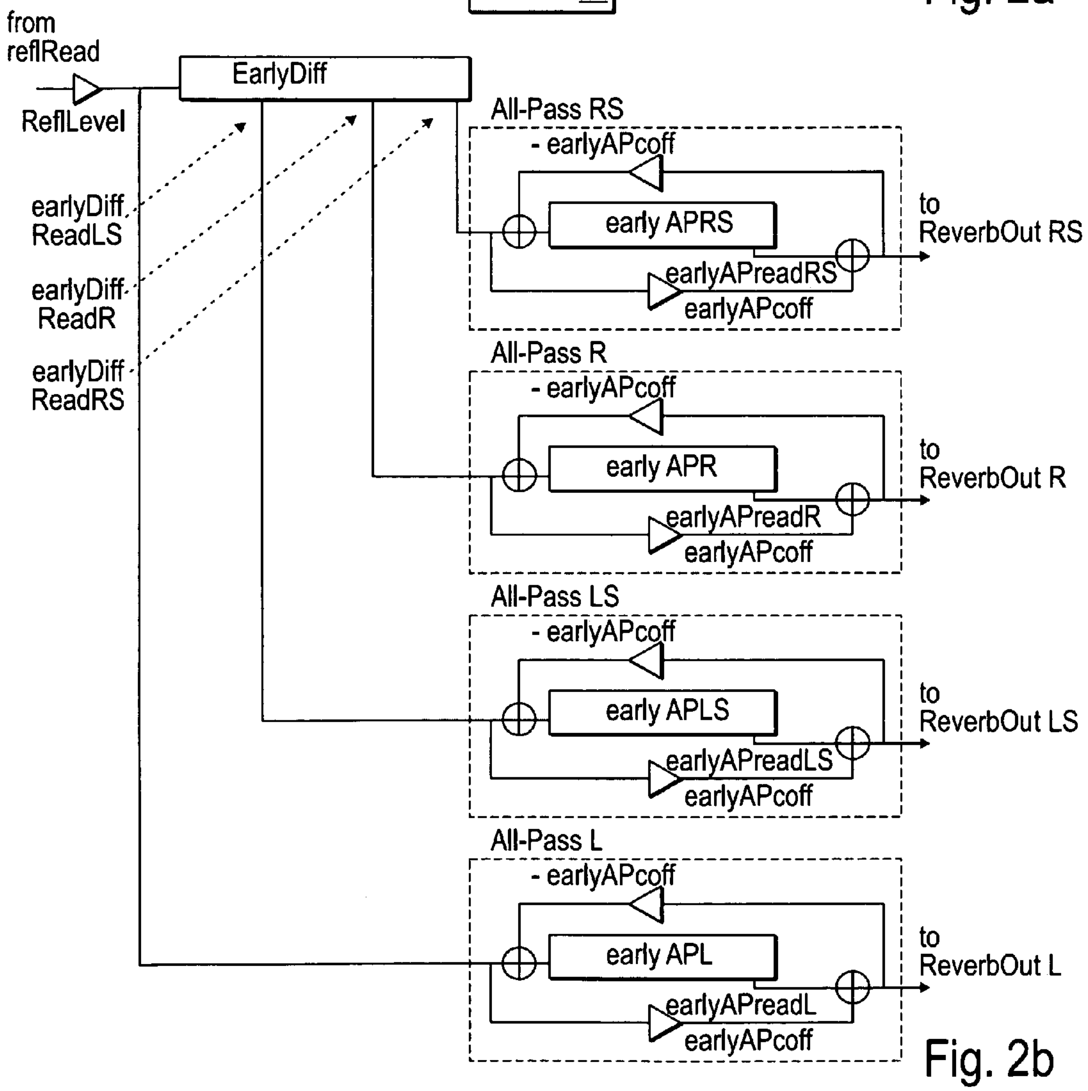
FIG. 2*b* is a block diagram of an early reflections module.
Figure 2C:
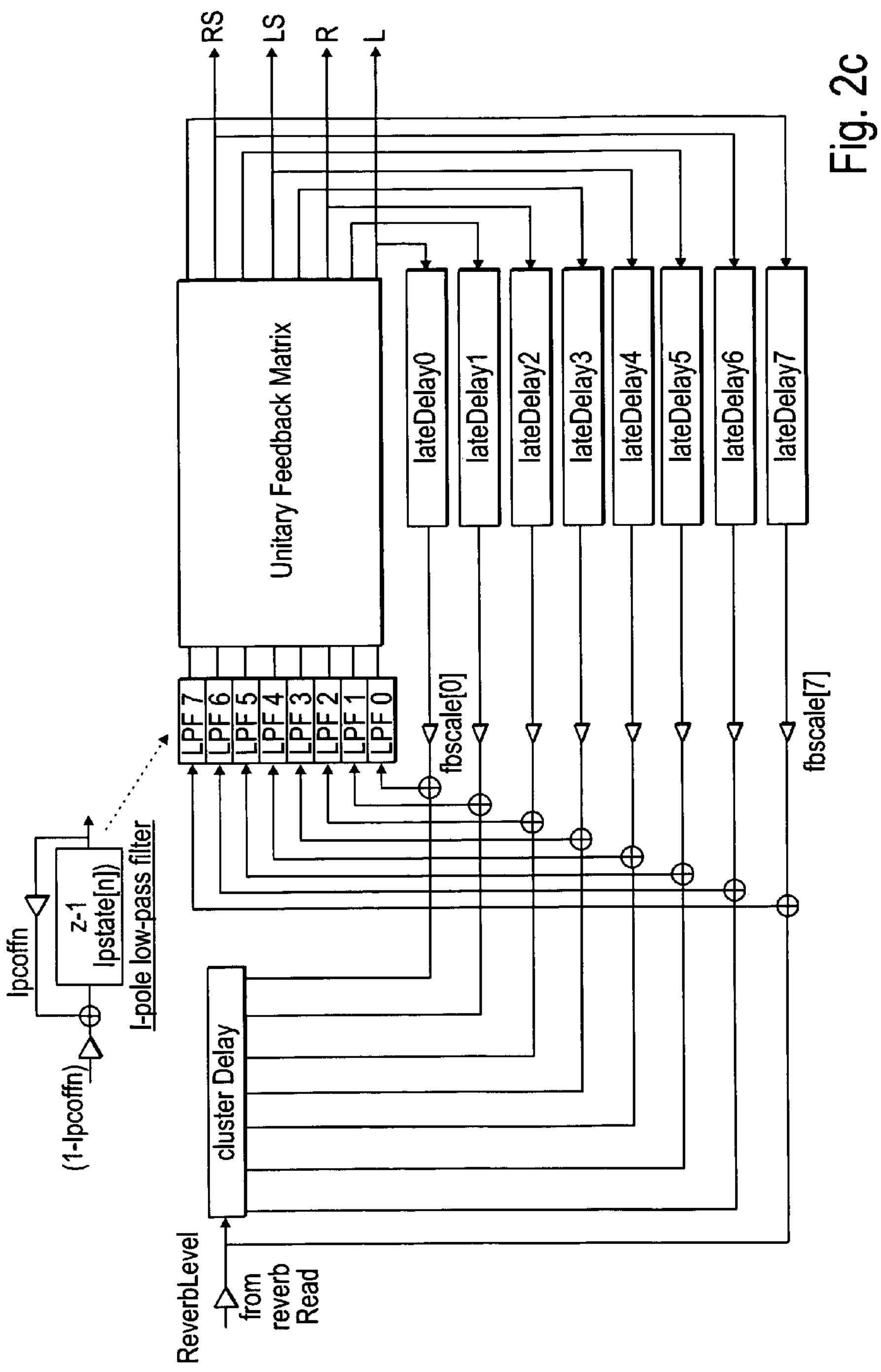
FIG. 2*c* is a block diagram of a late reverberation module.
Figure 2D:
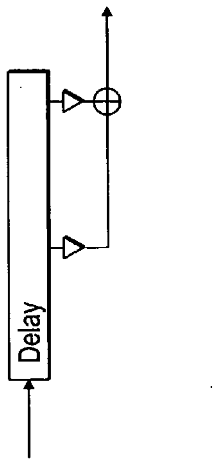
FIG. 2*d* is a block diagram of a variable delay line using a cross-fading technique.
Figure 3:
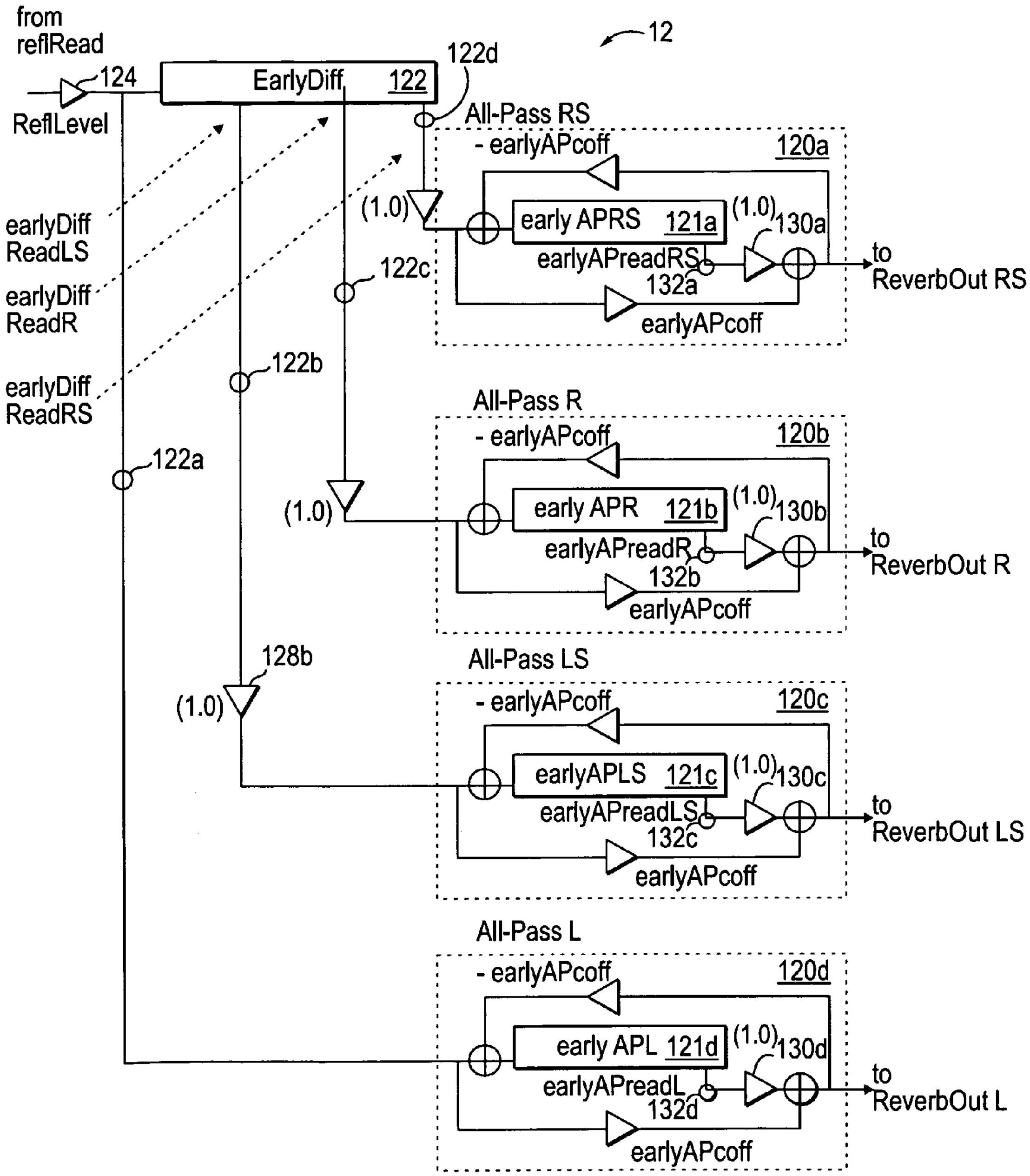
FIG. 3 is a schematic diagram of a modified early reflections module according to the present invention.
Figure 4:
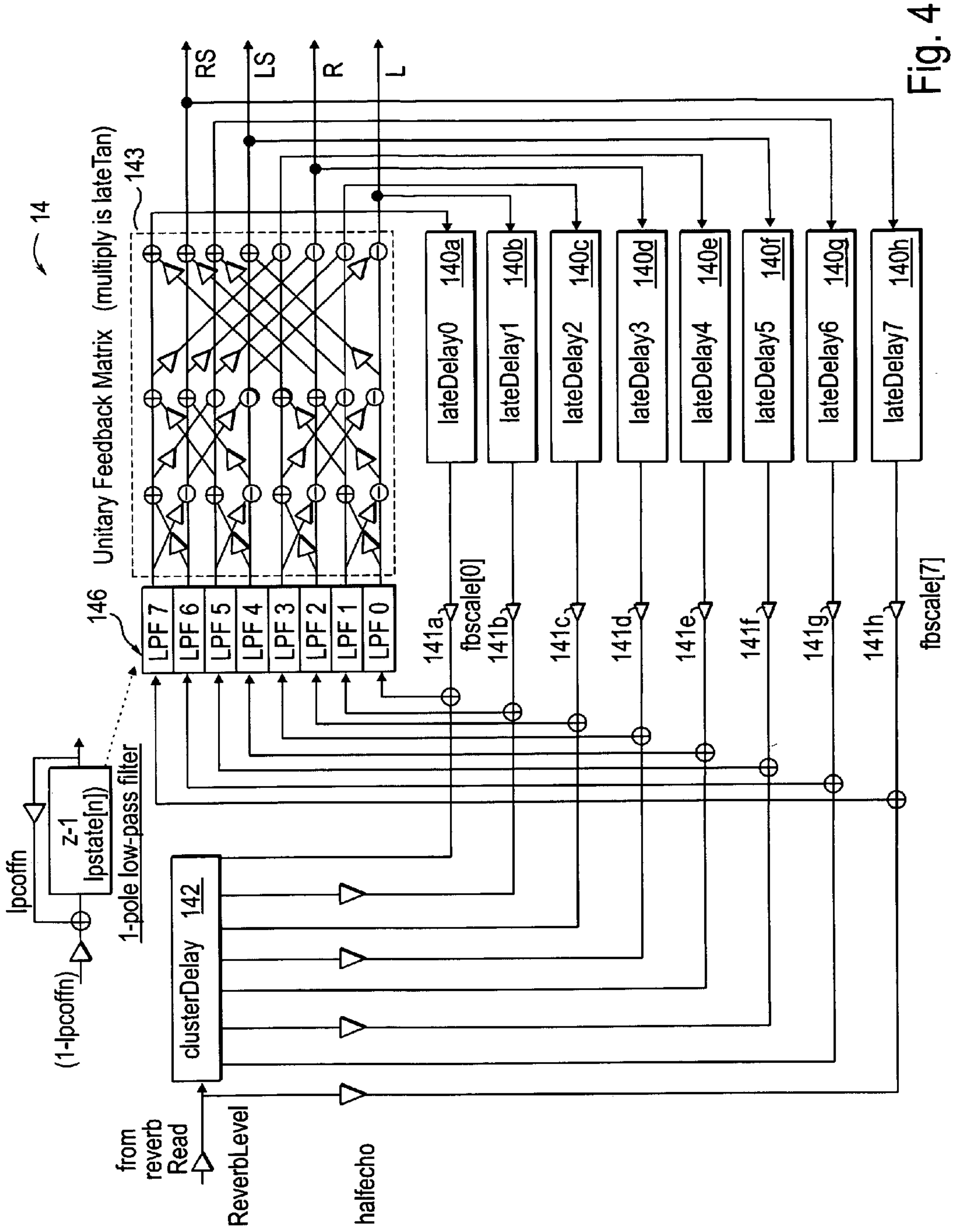
FIG. 4 is a schematic diagram of a modified late reverberation module according to the present invention.

FIGS. 3 and 4 depict novel implementations of the early and late reverberation blocks 12 and 14 of the standard reverberation processor 10 depicted in FIGS. 2*b* and 2*c*. In a preferred embodiment, the reverberation block is implemented by software executed by digital signal processors (DSP). However, the implementation of the blocks will be depicted as schematic diagrams of hardware where the equivalence between the hardware and software is well known to persons of skill in the art.

For example, the delay lines depicted in FIGS. 2, 3 and 4 are implemented using samples stored in RAM. The room- Delay delay line 15 has two reads 15*a* and *b* which respectively feed the Early Reflections module 12 and Late Reverb module 14. The locations of the two read pointers are determined by the values of the Reflections Delay and Reverb Delay parameters supplied to the Reverb module. The read which feeds the Early Reflections, called reflRead, is set by Reflections Delay to be up to 300 msec after the start of the delay line. The read which feeds the Late Reverb module, called reverbRead, is set by Reverb Delay to be up to 100 msec after reflRead.

Early Reflections Module

FIG. 3 depicts a preferred embodiment of the Early Reflections module 12 which is made up of four parallel all-pass filters 120*a–d* which are fed by a tapped delay line 122 (EarlyDiff). Each all-pass filter 120 includes an all-pass delay line 121. The input signal, which comes from roomDelay delay line 15, is multiplied by the coefficient, ReflLevel 124. The value of this coefficient is set by the parameter Reflections Level to control the level of the early reflections in the reverberation sound. When Reflections Delay is modified, ReflLevel is ramped down, then the read pointer reflRead is moved to its new location in the delay line 15, and then ReflLevel is ramped back up.

After ReflLevel the signal enters the delay line EarlyDiff 122. EarlyDiff 122 has 4 taps 122*a*, 122*b* (earlyDiffReadLS), 112*c* (earlyDiffReadR), and 122*d* (earlyDiffReadRS) distributed across its length, which feed the four all-pass filters 120. The first tap, 122*a*, is at a fixed delay length of 0. The range of the other three tap delays changes proportionally with the amplitude of Reverb Delay.

The three signals which are read from the EarlyDiff delay line 122 are multiplied by first level setting coefficients 128*b–c*, set initially to 1, as indicated in FIG. 3. These first level setting coefficients 128 are used to ramp down the signal when the delay line read pointers in the EarlyDiff delay line 122 are moved.

The four all-pass filters 120*a–d* are identical except for the lengths of their all-pass delay lines 121*a–d*. The read pointers 132*a* (earlyAPreadRS), 132*b* (earlyAPreadR), 132*c* (earlyAPreadLS), and 132*d* (earlyAPreadL) to the delay lines 121 in the four all-passes 120 (and hence the effective length of the all-pass delays) are distributed and scaled proportionally to the amplitude of Reverb Delay. The signals which are read from the all-pass delay lines 121 are multiplied by second level setting coefficients 130*a–d* set initially to 1. These second level setting coefficients 130 are ramped down and then up when the all-pass delay lengths are changed, to avoid artifacts. The all-pass coefficient used in all four filters, named earlyAPcoff, is set to the value of 0.4 (in this embodiment).

Late Reverb Module

FIG. 4 depicts a preferred embodiment of the Late Reverb module 14, made up of an 8-channel Feedback Delay Network (FDN) 140. The single input to the Late Reverb module, which comes from the reverbRead tap of the roomDelay delay line, feeds into the delay line clusterDelay 142. clusterDelay 142 has eight taps whose read pointer locations are constant and which feed the FDN.

There are eight delay lines 140*a–h* in the FDN 140, each having a different length. The total length of the delay lines 140*a–h* is specified by the Modal Density parameter. The outputs of all the lateDelay delay lines 140*a–h* are multiplied by the fbscale coefficients 141, which are used to control the Decay Time of the reverberation and to normalize the Feedback Matrix 143. Once these eight signals have the delayed input signals added to them they are passed through 1-pole low-pass filters 146 and enter the feedback matrix 148. Each low-pass filter has its own filter coefficient (Ipcoff0 for the 0th, etc.). The low-pass filter coefficients are adjusted according to the settings of the parameters Decay Time and Decay HF Ratio to control the decay time at high frequencies. Whenever one of the lateDelay read pointers 140*a–h* is updated, the corresponding fbscale and lpcoff coefficients are updated according to the current settings of Decay Time and Decay HF Ratio.

Continuous Control of Diffusion in the Feedback Matrix

After the outputs of each lateDelay delay line have been multiplied by an fbscale coefficient they are added to a delayed input signal, and filtered by a low-pass filter. The resulting signals are mixed together by a unitary mixing feedback matrix 143 before being fed back to the lateDelay delay line inputs. This feedback matrix can be changed from a diagonal matrix, which sends each of the inputs through unaffected, to a completely diffuse matrix, which mixes all of the input signals into each of the output signals. The amount of mixing affects the echo density of the reverb output, and is under control of the Diffusion parameter. A low Diffusion parameter value causes the feedback matrix to become diagonal, and a high value causes the matrix to become diffuse. An intermediate Diffusion value causes the matrix to be more or less diffuse.

The preferred implementation uses a recursive rotation matrix. A recursive rotation matrix can be made by applying a 2×2 rotation matrix to each pair of inputs, and then applying the same rotation to the outputs of the first rotation until all of the inputs have been mixed into each of the outputs, as described in FIG. 4. The amount of mixing of the final 8×8 matrix can be controlled by one value, lateTan, which is calculated from the Diffusion parameter as follows:

The feedback matrix is made unitary by applying a normalizing gain to the values of the fbscale mutlipliers. This value is dependant on the diffusion of the feedback matrix and is calculated as follows:

$$FdnFbScale=\cos^3(diffnorm*\pi/4)$$

Producing and Controlling a Repeating Echo in the Reverberation Decay

The lengths of the lateDelay delay lines 140 are distributed across a range of values. A repeating echo effect is achieved by reducing the range of lengths across which the delay lines are distributed. As the range becomes diminished, the repeating echo effect becomes more distinct.

The locations of the read pointers for the lateDelay lines in the FDN are determined by the values of Modal Density and Echo Depth according to the following equations (DelayLen[i] is the location in msec of the ith read pointer):

In a preferred embodiment, DMIN=39.1 msec, DMAX 150.1 msec.

As depicted in FIG. 4, clusterDelay 142 has eight taps whose locations are constant and which feed the FDN 140. Four of these eight taps have signals are multiplied by the coefficient halfecho 145. This coefficient is controlled by the parameter Diffusion, and is used in conjunction with EchoDepth to make echoes in the late reverb sound half as often. In a preferred embodiment:

halfecho=diffnorm

In addition to this muting of four of the eight signals entering the FDN by means of the halfecho coefficient, it is necessary to have each of the matrix outputs feed the next delay line (instead of the delay line which matches the matrix input), as shown in FIG. 4. This has the effect, when the diffusion parameter is low, of sequencing all of the delay lines into one long delay line which is fed and tapped at every other junction.

which has been calculated above.

The Sequence for Changing Reverberation Delays

There are five different parts of the reverberation processor which have delay line reads which must be updated without causing artifacts. In the preferred embodiment, many of the delay lines are modified when the Reverb Delay parameter is changed. This parameter controls the delay between the early reflections and late reverberation by changing the location of reverbRead. Changing the Reverb Delay parameter also spreads out the early reflections so that they span the time between Reflections Delay and the onset of the late reverberation. This is done by changing the EarlyDiff reads 122*b–d*, and by changing the early all-pass delay lengths 121*a–d*.

The parts that are changed are:

1. The pointer reflread, which reads from roomDelay 15 and feeds the Early Reflections module 12, is moved when the Reflections Delay parameter is changed.
2. The pointer reverbRead, which reads from roomDelay 15 and feeds the LateReverb module 14, might be moved whenever Reflections Delay or Reverb Delay are changed.
3. The three reads 122*b–d* from the EarlyDiff delay 122 in the Early Reflections module are moved in sequence whenever Reverb Delay changes.
4. The lengths of the four all-pass delays 121*a–d* in the Early Reflections module 12 are changed in sequence whenever Reverb Delay changes.
5. The lateDelay reads 140*a–h* in the Late Reverb module 14 are moved in sequence whenever the Modal Density, the Echo Depth or the Echo Time is changed.

The program which controls the DSP includes a function called GlitchlessSequence which performs the steps necessary to update all the aforementioned delay read pointers. GlitchlessSequence uses a timer callback when it is necessary to wait CBTIME milliseconds for the next step. The delay line reads are changed according to the following pseudo code sequence:

1. Change reflRead 15*b;*
2. Change reverbRead 15*a;*
3. If Reverb Delay has been changed or is in the process of being changed Continue;

Else if lateDelay read pointers need to be changed go to step #12;

Else if Reflections Delay has been changed go to step #1.

Else Break;

4. Change DiffReadR 122*c;*
5. Change DiffReadLS 122*b;*
6. Change DiffReadRS 122*d;*
7. Change earlyAPreadL 132*d;*
8. Change earlyAPreadR 132*b;*
9. Change earlyAPreadLS 132*c;*
10. Change earlyAPreadRS 132*a;*
11. If lateDelay read pointers need to be changed Continue;
    Else if Reflections Delay has been changed go to step #1;
    Else if Reverb Delay has been changed go to step #2;
    Else Break;
12. Change lateDelay read pointer 0, 140*a;*
13. Change lateDelay read pointer 1, 140*b;*
14. Change lateDelay read pointer 2, 140*c;*
15. Change lateDelay read pointer 3, 140*d;*
16. Change lateDelay read pointer 4, 140*e;*
17. Change lateDelay read pointer 5, 140*f;*
18. Change lateDelay read pointer 6, 140*g;*
19. Change lateDelay read pointer 7, 140*h;*
20. If Reflections Delay has been changed go to step #1;
    Else if Reverb Delay has been changed go to step #2;

Else if lateDelay read pointers need to be changed go to step #12;

Else Break;

Each of these steps is composed of a couple smaller steps similar to those described in the section Specifics of Updating One Delay Line Read Pointer.

If a change is made to Reflections Delay and the sequence is not in progress GlitchlessSequence will be called starting at step #1. If the sequence is in progress a flag will be set which is used by steps #3, #11, and #20 to make sure the correct delay lines are changed the next time through the sequence. Similarly, changes to Reverb Delay and changes to the lateDelay read pointers (caused by changes in Modal Density, Echo Depth or Echo Time) will start the GlitchlessSequence at steps #2 and #12, respectively, or, if the sequence is already in progress, set their own flags.

The Specifics of Changing One Delay Line Read Pointer

The reverberation processor uses an interpolate instruction to ramp a coefficient for one value, called Ramp1Sub, to another value, called Ramp1Dest, at a rate determined by a variable called RampConst. For example, when the ReflRead tap to the roomDelay delay line 15 is to be moved then the ReflLevel coefficient would be initially equal to Ramp 1 Sub and would be ramped as described below.

Specifically, at each sample period:

$$\text{Ramp1 Sub}=(\text{RampConst}*\text{Ramp 1 Sub})+((\mathbf{1}-\text{RampConst})*\text{Ramp 1Dest})$$

By replacing the ReflLevel coefficient with the new value Ramp1Sub at each sample period, the delayed signal can be ramped down or up, depending on the value of Ramp1Dest.

The value of RampConst determines how fast Ramp 1Sub approaches the value of Ramp1Dest, and therefore how much time each step of the ramping sequence will take. For a given ramp time in milliseconds, say CBTIME, RampConst is set to:

$$\text{RampConst}=2\hat{}(-15/(\text{CBTIME}*\text{SampleRate}/1000))$$

If Ramp1 Dest were set to zero, for example, it would take Ramp 1Sub CBTIME milliseconds to reach 15 bits below its original value. In the preferred embodiment CBTIME is 20 milliseconds.

The primary steps to move one delay line read pointer, reflRead for example, are as follows: ramp down ReflLevel, move reflRead, and ramp ReflLevel back up. However, to accomplish these steps there is a more detailed sequence of events that must take place.

1. Set Ramp1Dest to the value of ReflLevel. This must be done so that the ramper does not ramp Ramp1Sub away before we can substitute it in for ReflLevel.

2. Set Ramp1Sub to the value of ReflLevel, so that there will be no level jump when the substitution is made.

3. Replace ReflLevel with Ramp1Sub in the instruction that multiplies the signal read from reflRead.

4. Set Ramp 1 Dest to zero, so that the ramper starts ramping down.

5. Wait CBTIME milliseconds while Ramp1Sub ramps down.

6. Move reflRead to the new location.

7. Set Ramp1Dest to the value of ReflLevel to start ramping up.

8. Wait CBTIME milliseconds while Ramp1Sub ramps up.

9. If ReflLevel has been changed since step 7,

Set ReflLevel to the value of Ramp1Sub,

Replace Ramp1Sub with ReflLevel in the multiply instruction,

Call the routine that would normal ramp ReflLevel if there were no update of the reflRead pointer.

10. If ReflLevel has not been changed, replace Ramp1Sub with ReflLevel in the multiply instruction If another delay line read pointer must be changed it can begin its own similar sequence immediately. It is not necessary to wait another time step.

The invention has now been described with reference to the preferred embodiments. Alternatives and substitutions will now be apparent to persons of skill in the art. For example, the particular ramping algorithm or delay configurations described can be modified by persons of skill in the art while practicing the principles of the invention. Accordingly, it is not intended to limit the invention except as provided by the appended claims.

What is claimed is:

1. In a reverb processor that includes delay lines implemented in delay line memory and having delay taps implemented by read pointers into the delay line memory, a method, comprising:

for each delay line having a read pointer to be moved:

providing a level control variable having an initial amplitude;

selecting a first delay line:

prior to moving the read pointer of the first delay line, ramping down the amplitude of the level control variable for the first delay line to a target amplitude;

moving the read pointer of the first delay line when the amplitude level control variable for the first delay line has reached the target amplitude;

ramping the amplitude of the level control variable of the first delay line back to the first initial level subsequent to moving the read pointer of the first delay line;

subsequent to ramping the amplitude of the level control variable of the first delay line back to the first initial level, selecting a second delay line:

prior to moving the read pointer of the second delay line, ramping down the amplitude of the level control variable for the second delay line to a target amplitude;

moving the read pointer of the second delay line when the amplitude level control variable for the second delay line has reached the target amplitude;

ramping the amplitude of the level control variable of the second delay line back to the second initial level subsequent to moving the read pointer of the second delay line.

2. In a reverb processor that includes an early reflection module coupled to a delay tap of an input delay line, with the early reflection module including first and second delay lines for modeling early reflections, and with all delay lines implemented in delay line memory and having delay taps implemented by read pointers into the delay line memory, a method comprising:

providing an input level control variable having an initial amplitude;

prior to moving the read pointer of the input delay line, ramping down the amplitude of the level control variable for the first delay line to a target amplitude;

moving the read pointers of the input delay line when the amplitude level control variable for the input delay line has reached the target level;

ramping the amplitude of the level control variable of the input delay line back to the first initial level subsequent to moving the read pointer of the input delay line;

selecting the first delay line of said early reflection module;

prior to moving a read pointer of the first delay line, ramping down the amplitude of the level control variable for the first delay line to a target amplitude;

moving the read pointer of the first delay line when the amplitude level control variable for the first delay line has reached the target level;

ramping the amplitude of the level control variable of the first delay line back to the first initial level subsequent to moving the read pointer of the first delay line;

selecting the second delay line of said early reflection module;

prior to moving a read pointer of the second delay line, ramping down the amplitude of the level control variable for the second delay line to a target amplitude;

moving the read pointer of the second delay line when the amplitude level control variable for the second delay line has reached the target level; and ramping the amplitude of the level control variable of the second delay line back to the second initial level subsequent to moving the read pointer of the second delay line.

3. In a reverb processor that includes delay lines implemented in delay line memory and includes delay taps implemented by read pointers to the delay lines, a method for changing environmental parameters comprising:

selecting a delay line, each delay line having a single read pointer;

prior to moving the read pointer of the selected delay line, ramping down an amplitude of a level control variable for the selected delay line from an initial amplitude to a target amplitude;

moving said read pointer of the selected delay line when the amplitude level control variable for the selected delay line has reached the target amplitude;

ramping the amplitude of the level control variable for the selected delay line back towards its initial amplitude subsequent to moving said read pointer of the selected delay line, wherein each delayed output sample associated with the delay line is derived from a single signal value identified by the single read pointer and wherein the selected delay line is a first delay line;

subsequent to ramping the amplitude of the level control variable of the first delay line back to its initial amplitude and prior to moving a read pointer of a second delay line, ramping down the amplitude of a level control variable for the second delay line from a second initial amplitude to a target amplitude;

moving the read pointer of the second delay line when the amplitude level control variable for the second delay line has reached the target amplitude; and ramping the amplitude of the level control variable of the second delay line back to the second initial amplitude subsequent to moving the read pointer of the second delay line.

4. A machine-readable medium including instructions which, when executed by a machine, cause the machine to:

select a delay line in a reverb processor that includes delay lines implemented in delay line memory and includes delay taps implemented by read pointers to the delay lines, each delay line having a single read pointer;

prior to moving the read pointer of the selected delay line, ramp down an amplitude of a level control variable for the selected delay line from an initial amplitude to a target amplitude;

move said read pointer of the selected delay line when the amplitude level control variable for the selected delay line has reached the target amplitude;

ramp the amplitude of the level control variable for the selected delay line back towards its initial amplitude subsequent to moving said read pointer of the selected delay line, wherein each delayed output sample associated with the delay line is derived from a single signal value identified by the single read pointer and wherein the selected delay line is a first delay line;

subsequent to ramping the amplitude of the level control variable of the first delay line back to its initial amplitude, and prior to moving a read pointer of a second delay line, ramp down the amplitude of a level control variable for the second delay line from a second initial amplitude to a target amplitude;

move the read pointer of the second delay line when the amplitude level control variable for the second delay line has reached the target amplitude; and ramp the amplitude of the level control variable of the second delay line back to the second initial amplitude subsequent to moving the read pointer of the second delay line.

* * * * *